(12) United States Patent
Park et al.

(10) Patent No.: US 8,674,367 B2
(45) Date of Patent: Mar. 18, 2014

(54) ORGANIC LIGHT-EMITTING DISPLAY DEVICE HAVING PROTRUSIONS AND RECESSES FORMED ON CONDUCTIVE LAYER IN PAD PORTION AND METHOD OF MANUFACTURING THE SAME

(75) Inventors: Sun Park, Suwon-si (KR); Chun-gi You, Cheongju-si (KR); Jong-Hyun Park, Asan-si (KR); Yul-Kyu Lee, Yongin-si (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 204 days.

(21) Appl. No.: 13/108,420

(22) Filed: May 16, 2011

(65) Prior Publication Data

US 2012/0138935 A1  Jun. 7, 2012

(30) Foreign Application Priority Data

Dec. 7, 2010  (KR) .......................... 10-2010-0124283

(51) Int. Cl.
| | |
|---|---|
| *H01L 27/14* | (2006.01) |
| *H01L 29/04* | (2006.01) |
| *H01L 29/15* | (2006.01) |
| *H01L 31/036* | (2006.01) |
| *H01L 23/48* | (2006.01) |
| *H01L 23/52* | (2006.01) |
| *H01L 29/40* | (2006.01) |
| *H01L 21/00* | (2006.01) |
| *G02F 1/1345* | (2006.01) |

(52) U.S. Cl.
USPC ........ 257/72; 257/59; 257/739; 257/E23.015; 257/E23.02; 438/34; 349/151

(58) Field of Classification Search
None
See application file for complete search history.

(56) References Cited

U.S. PATENT DOCUMENTS

| 7,439,539 B2* | 10/2008 | Jeoung et al. ................. 257/59 |
| 7,576,825 B2* | 8/2009 | Jung .............................. 349/152 |
| 2007/0075313 A1* | 4/2007 | Kwak et al. ..................... 257/59 |
| 2007/0076393 A1* | 4/2007 | Jeong et al. ................... 361/767 |
| 2010/0139953 A1* | 6/2010 | Kim .............................. 174/256 |
| 2012/0139000 A1* | 6/2012 | Lee et al. ........................ 257/99 |

FOREIGN PATENT DOCUMENTS

| KR | 19960013506 B1 | 10/1996 |
| KR | 100635062 A | 8/2005 |
| KR | 1020090127220 A | 12/2009 |
| KR | 1020100005525 A | 1/2010 |

* cited by examiner

*Primary Examiner* — Michael Jung
(74) *Attorney, Agent, or Firm* — Robert E. Bushnell, Esq.

(57) ABSTRACT

Provided is an organic light-emitting display device. The organic light-emitting display device includes: a substrate; a buffer layer formed on the substrate; a gate insulating layer formed on the buffer layer; a conductive layer formed on the gate insulating layer; and a pixel defined layer exposing a portion of the conductive layer to form a pad portion connected to bumps of a drive integrated circuit (IC) chip, wherein protrusions and recesses are formed on a surface of the conductive layer.

26 Claims, 7 Drawing Sheets

ORGANIC LIGHT-EMITTING DISPLAY DEVICE HAVING PROTRUSIONS AND RECESSES FORMED ON CONDUCTIVE LAYER IN PAD PORTION AND METHOD OF MANUFACTURING THE SAME

CLAIM OF PRIORITY

This application makes reference to, incorporates the same herein, and claims all benefits accruing under 35 U.S.C. §119 from an application earlier filed in the Korean Intellectual Property Office on 7 Dec. 2010 and there duly assigned Serial No. 10-2010-0124283.

BACKGROUND OF THE INVENTION

1. Field of the Invention

The present invention relates to an organic light-emitting display device and a method of manufacturing the same, and more particularly, to an organic light-emitting display device including a pad portion which is connected to a drive integrated circuit (IC) chip and a method of manufacturing the organic light-emitting display device.

2. Description of the Related Art

The rapid development of the information and technology (IT) industry is dramatically increasing the use of display devices. Recently, there have been demands for display devices that are lightweight and thin, consume low power and provide high resolution. To meet these demands, liquid crystal displays or organic light-emitting displays using organic light-emitting characteristics are being developed.

Organic light-emitting displays, which are next-generation display devices having self light-emitting characteristic, have better characteristics than liquid crystal displays in terms of viewing angle, contrast, response speed and power consumption, and can be manufactured to be thin and lightweight since a backlight is not required.

An organic light-emitting display includes a substrate having a pixel region and a non-pixel region and a container or another substrate which is placed to face the substrate for encapsulation and attached to the substrate by a sealant such as epoxy. In the pixel region of the substrate, a plurality of organic light-emitting diodes (OLEDs) are connected in a matrix pattern between scan lines and data lines to form pixels. In the non-pixel region, the scan lines and the data lines extending from the scan lines and the data lines of the pixel region, power source supply lines (not shown) for operating the organic light-emitting diodes, and a scan driver and a data driver for processing signals received from an external source via input pads and providing the processed signals to the scan lines and the data lines are formed. The scan driver and the data driver respectively include driving circuits for processing signals transmitted from the external source and generating scan signals and data signals. The scan driver and the data driver may be formed in the process of manufacturing the OLEDs or may be manufactured as additional integrated circuit (IC) chips to be mounted on a substrate.

When the scan driver and the data driver are manufactured as additional IC chips to be mounted on a substrate, the drive IC chips may be mounted using a tape automated bonding method in which the drive IC chips are mounted on a tape carrier package (TCP) and connected to pads of the substrate or using a chip on glass (COG) method in which the driver IC chips are attached directly to the pads of the substrate. The COG method ensures a simpler structure and requires a smaller area than the TAB method. Thus, the COG method is widely employed for small and medium sized display panels of mobile telecommunications products.

In the COG method, bumps formed on input and output terminals of a drive IC chip are connected to an inner lead bonding (ILB) pad and an outer lead bonding (OLB) pad formed on a substrate by conductive balls contained in an anisotropic conductive film (ACF).

An input pad coupled to the ILB pad is connected to a flexible printed circuit (FPC). In response to control and data signals supplied from an external source through the FPC, the drive IC chips generate scan and data signals and provide the generated scan and data signals to the OLEDs via the scan lines and the data lines connected to the OLB pad.

A pad portion included in a conventional organic light-emitting display device has a flat surface. Therefore, the pad portion is electrically connected to a drive IC chip thereabove by a plurality of conductive balls and receives signals from an external source through the driver IC chip.

When a thickness of a conductive layer exposed through the surface of the pad portion is greater than 300 Å, it is not easy to etch the metal or indium tin oxide (ITO) that forms the conductive layer, and a stronger acid is required to etch a thicker conductive layer. Therefore, a thicker conductive layer leads to the risk of using a stronger acid that cannot be handled easily and is harmful to workers.

For this reason, the conductive layer may be formed to a thickness of less than 300 Å. However, as the conductive layer becomes thinner, the difference between the contact resistance and surface resistance of the conductive layer increases due to film dispersion, and the increased difference degrades the reliability of the organic light-emitting display device when in operation.

SUMMARY OF THE INVENTION

Aspects of the present invention provide an organic light-emitting display device including a pad portion which is thin but has low contact resistance.

However, aspects of the present invention are not restricted to the one set forth herein. The above and other aspects of the present invention will become more apparent to one of ordinary skill in the art to which the present invention pertains by referencing the detailed description of the present invention given below.

According to an aspect of the present invention, there is provided an organic light-emitting display device including: a substrate; a buffer layer formed on the substrate; a gate insulating layer formed on the buffer layer; a conductive layer formed on the gate insulating layer; and a pixel defined layer exposing a portion of the conductive layer to form a pad portion connected to bumps of a drive integrated circuit (IC) chip, wherein protrusions and recesses are formed on a surface of the conductive layer.

According to another aspect of the present invention, there is provided an organic light-emitting display device including: a substrate; a buffer layer formed on the substrate; a gate insulating layer formed on the buffer layer; a conductive layer formed to a uniform thickness on the gate insulating layer; a pixel defined layer exposing a portion of the conductive layer to form a pad portion connected to bumps of a drive IC chip; and a semiconductor layer disposed under the pad portion and formed between the gate insulating layer and the buffer layer, wherein first protruding and recessed patterns are formed on a portion of the semiconductor layer which corresponds to the pad portion, and second protruding and recessed patterns are formed on a portion of the gate insulating layer which corresponds to the pad portion.

According to another aspect of the present invention, there is provided a method of manufacturing an organic light-emitting display device. The method includes: forming a buffer layer on a substrate; forming a gate insulating layer on the buffer layer; forming a conductive layer on the gate insulating layer; and forming a pixel defined layer such that a portion of the conductive layer is exposed to form a pad portion connected to bumps of a drive IC chip, wherein the forming of the conductive layer includes forming protrusions and recesses on a surface of the exposed portion of the conductive layer which corresponds to the pad portion.

According to another aspect of the present invention, there is provided a method of manufacturing an organic light-emitting display device. The method includes: forming a buffer layer on a substrate; forming a gate insulating layer on the buffer layer; forming a conductive layer to a uniform thickness on the gate insulating layer; forming a pixel defined layer such that a portion of the conductive layer is exposed to form a pad portion connected to bumps of a drive IC chip; forming a semiconductor layer under the pad portion and between the gate insulating layer and the buffer layer, wherein the forming of the semiconductor layer includes forming first protruding and recessed patterns on a portion of the semiconductor layer which corresponds to the pad portion by patterning the portion of the semiconductor layer, and the forming of the gate insulating layer includes forming second protruding and recessed patterns on a portion of the gate insulating layer which corresponds to the pad portion.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Advantages and features of the present invention and methods of accomplishing the same may be understood more readily by reference to the following detailed description of exemplary embodiments and the accompanying drawings. The present invention may, however, be embodied in many different forms and should not be construed as being limited to the embodiments set forth herein. Rather, these embodiments are provided so that this disclosure will be thorough and complete and will fully convey the concept of the invention to those skilled in the art, and the present invention will only be defined by the appended claims. In the drawings, sizes and relative sizes of layers and regions may be exaggerated for clarity.

It will be understood that when an element or layer is referred to as being "on" another element or layer, the element or layer can be directly on another element or layer or intervening elements or layers may also be present. In contrast, when an element is referred to as being "directly on" another element or layer, there are no intervening elements or layers present. As used herein, the term "and/or" includes any and all combinations of one or more of the associated listed items.

Spatially relative terms, such as "below", "beneath", "lower", "above", "upper", and the like, may be used herein for ease of description to describe one element or feature's relationship to another element(s) or feature(s) as illustrated in the figures. It will be understood that the spatially relative terms are intended to encompass different orientations of the device in use or operation, in addition to the orientation depicted in the figures. Like reference numerals refer to like elements throughout the specification.

Embodiments of the invention are described herein with reference to plan and cross-section illustrations that are schematic illustrations of idealized embodiments of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. Thus, the regions illustrated in the figures are schematic in nature and their shapes are not intended to illustrate the actual shape of a region of a device and are not intended to limit the scope of the invention.

Hereinafter, exemplary embodiments of the present invention will be described in further detail with reference to the accompanying drawings.

Figure 1:
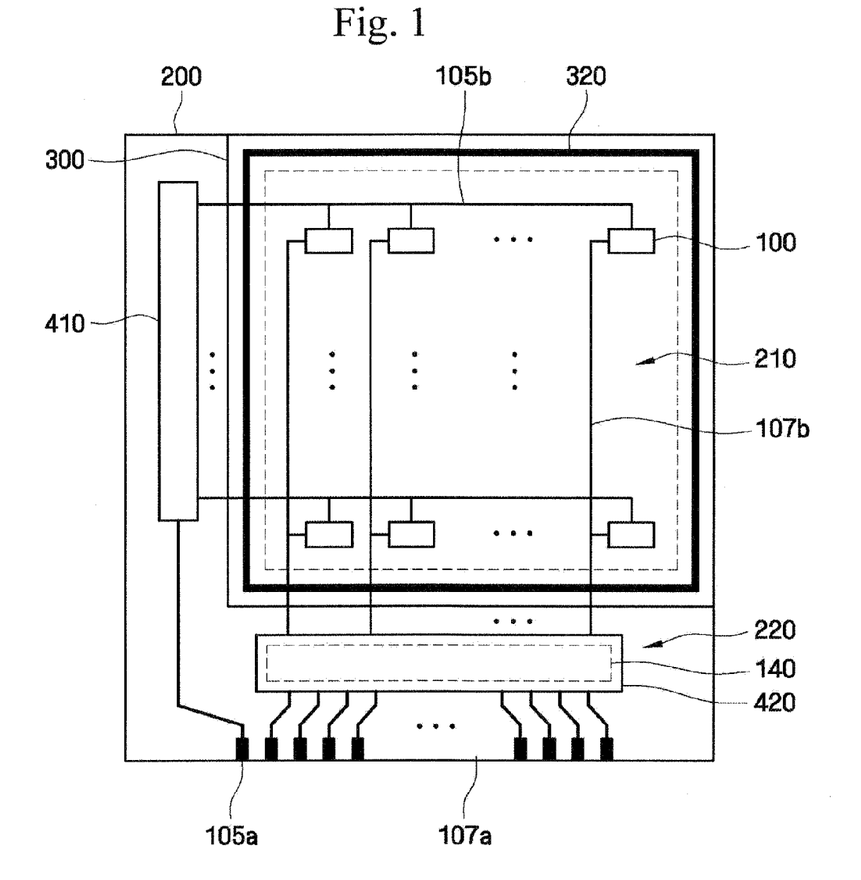
FIG. 1 is a plan view of an organic light-emitting display device according to an exemplary embodiment of the present invention.
Figure 2:
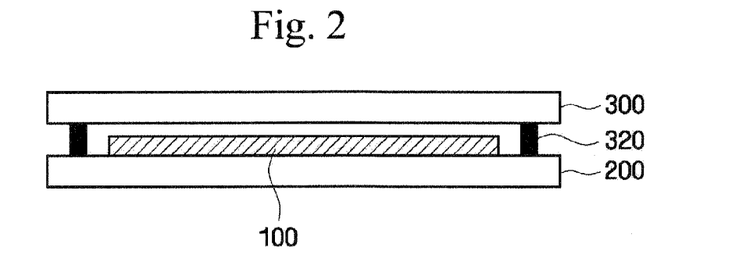
FIG. 2 is a schematic cross-sectional view of the organic light-emitting display device according to the exemplary embodiment of the present invention.

FIGS. 1 and 2 are plan and cross-sectional views of an organic light-emitting display device according to an exemplary embodiment of the present invention. The organic light-emitting display device according to the exemplary embodiment of the present invention includes a substrate 200 which is made of a transparent material and has a pixel region 210 and a non-pixel region 220 and an encapsulation substrate 300 which is placed to face the substrate 200 so as to encapsulate the pixel region 210 and is attached to the substrate 200 by a sealant 320.

The substrate 200 is a transparent insulating substrate made of glass or plastic. The encapsulation substrate 300 is made not only of a glass material but also of various plastic materials such as acryl. Further, a metal plate can be used for the encapsulation substrate 300. The sealant 320 may be a sealing glass frit, as generally used in the art. Alternatively, the sealant 320 may be made of an organic sealant, an inorganic sealant, or an organic/inorganic hybrid sealant.

The organic sealant may be at least one material selected from the group consisting of acrylic resin, methacrylic resin, polyisoprene, vinyl resin, epoxy resin, urethane resin, and cellulose resin. Examples of the inorganic sealant include metals, such as silicon, aluminum, titanium and zirconium, and non-metals such as metal oxides. The organic/inorganic hybrid sealant is a material in which a non-metal or metal such as silicon, aluminum, titanium, zirconium, etc., is covalently bonded to an organic material. The organic/inorganic hybrid sealant may be at least one material selected from the group consisting of epoxy silane and its derivative, a vinyl silane and its derivative, amine silane and its derivative, methacrylate silane, and a resultant material of a partial hardening reaction of any of these substances.

In the pixel region 210 of the substrate 200, a plurality of organic light-emitting diodes (OLEDs) 100 are connected in a matrix pattern between scan lines 105b and data lines 107b to form pixels. In the non-pixel region 220 of the substrate 200, the scan lines 105b and the data lines 107b are formed extending from the scan lines 105b and the data lines 107b of the pixel region 210. Power source supply lines (not shown) for operating the OLEDs 100, and a scan driver 410 and a data driver 420 for processing signals received from an external source via input pads 105a and 107a and providing the processed signals to the scan lines 105b and the data lines 107b are formed.

In a case where the organic light-emitting display device is a passive matrix organic light-emitting display device, the OLEDs 100 are connected in a matrix pattern between the scan lines 105b and the data lines 107b. In a case where the organic light-emitting display device is an active matrix organic light-emitting display device, the OLEDs 100 are connected in a matrix pattern between the scan lines 105b and the data lines 107b, and thin-film transistors (TFTs) for controlling the operation of the OLEDs 100 and capacitors for sustaining signals are further provided.

Figure 3:
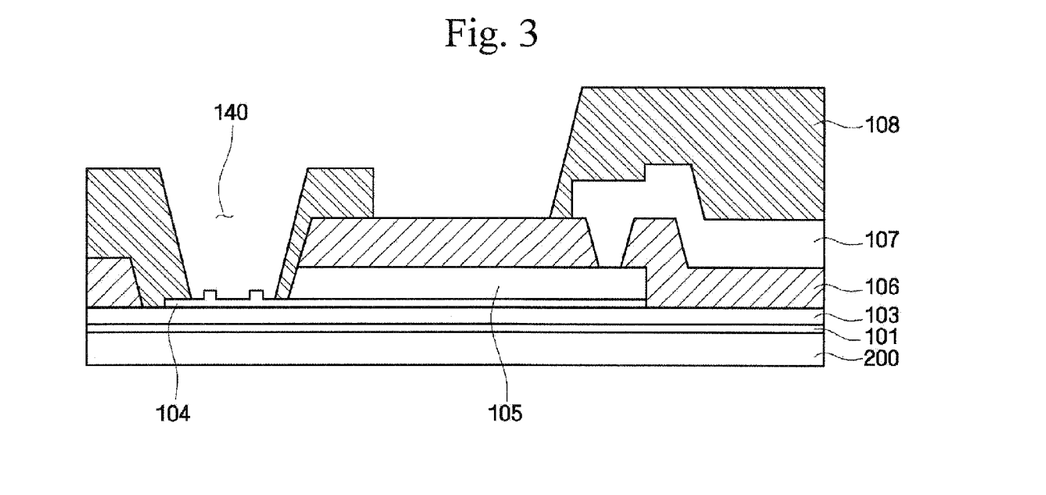
FIGS. 3 through 5 are cross-sectional views of the vicinity of a pad portion of the organic light-emitting display device according to the exemplary embodiment of the present invention.
Figure 4:
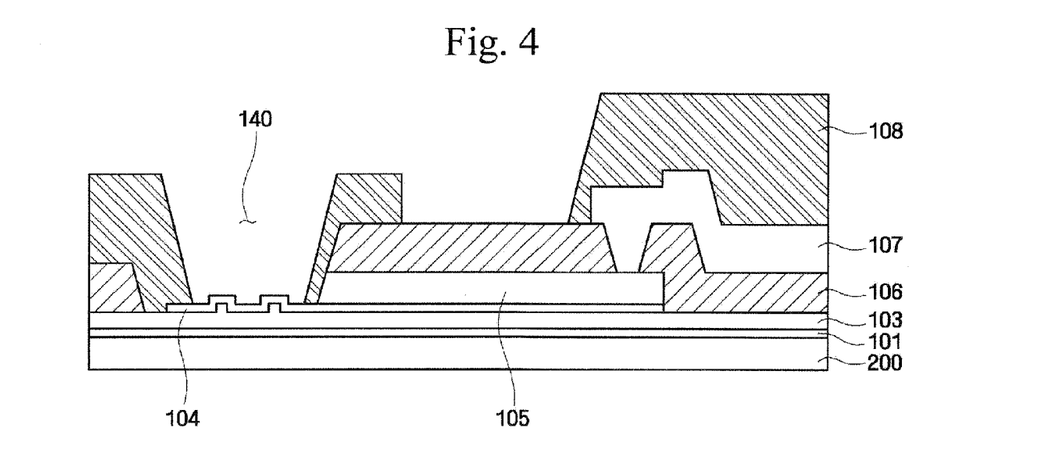
Figure 5:
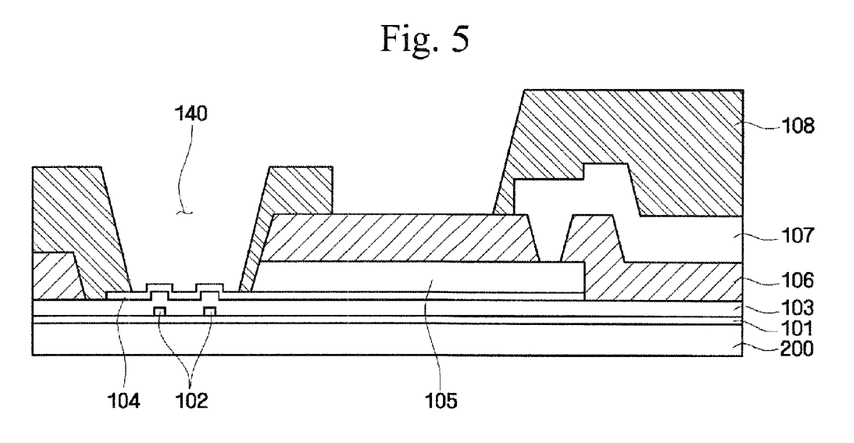

FIGS. 3 through 5 are cross-sectional views of the vicinity of a pad portion 140 of the organic light-emitting display device according to the exemplary embodiment of the present invention. The organic light-emitting display device according to the exemplary embodiment of the present invention includes the substrate 200, a buffer layer 101 formed on the substrate 200, a gate insulating layer 103 formed on the buffer layer 101, a conductive layer 104 formed on the gate insulating layer 103, and a pixel defined layer 108 exposing a portion of the conductive layer 104 to form the pad portion 140 connected to bumps 430 (see FIG. 6) of a drive integrated circuit (IC) chip 400 (see FIG. 6). Protrusions and recesses are formed on a surface of the conductive layer 104.

The substrate 200 may be made of a transparent glass material containing $SiO_2$ as its main component. However, the material that forms the substrate 200 is not limited to the transparent glass material. The substrate 200 may also be made of a transparent plastic material that may be an insulating organic material selected from the group consisting of polyethersulphone (PES), polyacrylate (PAR), polyetherimide (PEI), polyethylene napthalate (PEN), polyethylene terephthalate (PET), polyphenylene sulfide (PPS), polyallylate, polyimide, polycarbonate (PC), cellulose triacetate (TAC), and cellulose acetate propionate (CAP).

In a case where the organic light-emitting display device is a bottom emission organic light-emitting display device in which an image is realized toward the substrate 200, the substrate 200 should be made of a transparent material. However, in a case where the organic light-emitting display device is a top emission organic light-emitting display device in which an image is realized away from the substrate 200, the substrate 200 may not be necessarily made of a transparent material. In this case, the substrate 200 may be made of a metal. When the substrate 200 is made of a metal, the substrate 200 may include at least one material selected from the group consisting of carbon, iron, chrome, manganese, nickel, titanium, molybdenum, and stainless steel (SUS). However, the material that forms the substrate 200 is not limited to the above materials. The substrate 200 may also be made of a metal foil.

The buffer layer 101 may be formed on the substrate 200 to planarize the substrate 200 and prevent penetration of impurities into the substrate 200. The semiconductor layer 102 may be formed to provide source and drain regions and a channel region on the buffer layer 101 of a transistor portion (not shown). A portion of the semiconductor layer 102 on the buffer layer 101 of the pad portion 140 may be patterned into protrusions and recesses. Accordingly, the conductive layer 104 formed above the semiconductor layer 102 may also have protrusions and recesses corresponding to the protrusions and recesses of the semiconductor layer 102, as shown in FIG. 5.

A gate electrode 105 is formed on the conductive layer 104, and an interlayer insulating film 106 is formed on the gate electrode 105. A contact hole exposing the gate electrode 105 is formed in the interlayer insulating film 106. The gate electrode 105 is connected to a source/drain electrode 107 by the contact hole. The source/drain electrode 107 is formed on the interlayer insulating film 106 and filled in the contact hole of the interlayer insulating film 106. The pixel defined layer 108 is formed on the source/drain electrode 107.

As described above, a portion of the conductive layer 104 is exposed in the pad portion 140 and thus electrically connected to the bumps 430 of the drive IC chip 400. Accordingly, the conductive layer 104 receives a signal from the drive IC chip 400 and transmits the received signal to the source/drain electrode 107 via the gate electrode 105, thereby driving the source/drain electrode 107. The conductive layer 104 may be made of an opaque conductive metal material or a mixture of one or more transparent conductive materials selected from the group consisting of indium tin oxide (ITO), indium zinc oxide (IZO), carbon nanotubes, nanowires, and a conductive polymer.

Figure 6:
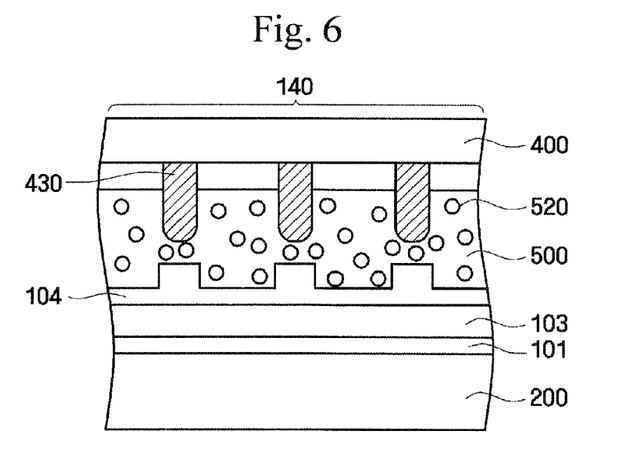
FIG. 6 is a cross-sectional view showing a drive integrated circuit (IC) chip mounted on the pad portion of the organic light-emitting display device according to the exemplary embodiment of the present invention.

The conductive layer 104 may be electrically connected to the bumps 430 of the drive IC chip 400 by a plurality of conductive balls 520 (see FIG. 6). The conductive balls 520 may have a smaller diameter than the protrusions and recesses formed on a surface of the conductive layer 104. When the diameter of the conductive balls 520 is greater than that of the protrusions and recesses formed on the surface of the conductive layer 104, more specifically, greater than the gap between the protrusions, the conductive balls 520 cannot enter the spaces between the protrusions. The configuration of the bumps 430 of the drive IC chip 400 and the conductive balls 520 will be described later with reference to FIG. 6.

When the conductive layer 104 is formed to a thickness of less than 300 Å in view of, e.g., etching, the difference between the contact resistance and surface resistance of the conductive layer 104 may increase due to film dispersion, and the increased difference may degrade the reliability of the organic light-emitting display device when in operation. To prevent this problem, in the organic light-emitting display device according to the exemplary embodiment of the present invention, protrusions and recesses are formed on a surface of a portion of the conductive layer 104 which is exposed between portions of the pixel defined film 108. The protrusions and recesses formed on the surface of the exposed portion of the conductive layer 104 increase the contact area between the conductive layer 104 and the conductive balls 520 in the region of the pad portion 140, thereby reducing contact resistance.

Protrusions and recesses may be formed directly on a surface of the conductive layer 104 as shown in FIG. 3. Alternatively, as shown in FIGS. 4 and 5, protrusions and recesses may be formed on the buffer layer 101 or the gate insulating layer 103 disposed under the conductive layer 104, and the conductive layer 104 may be formed on the protrusions and the recesses. Accordingly, the conductive layer 104 may have protrusions and recesses corresponding to the protrusions and recesses of the buffer layer 101 or the gate insulating layer 103.

That is, referring to FIG. 4, the gate insulating layer 103 may be formed and then etched such that protrusions and recesses are formed on a surface of a portion of the gate insulating layer 103 which corresponds to the pad portion 140. Then, the conductive layer 104 may be formed on the gate insulating layer 103 having the protrusions and recesses. Accordingly, protrusions and recesses may also be formed on a surface of the conductive layer 104. Although not shown in the drawings, the buffer layer 101 formed on the substrate 200 may be etched, instead of the gate insulating layer 103, such that protrusions and recesses are formed on a surface of the buffer layer 101, and the gate insulating layer 103 and the conductive layer 104 may be formed on the buffer layer 103 having the protrusions and recesses. In this way, protrusions and recesses may be formed on a surface of the conductive layer 104.

Also, as described above, a portion of the semiconductor layer 102 formed in the process of constructing the transistor portion (not shown) may be patterned into protrusions and recesses to remain in the pad portion 140. Then, the gate insulating layer 103 and the conductive layer 104 may be formed on the semiconductor layer 102 having the protrusions and recesses. Accordingly, protrusions and recesses may be formed on a surface of the conductive layer 104, as shown in FIG. 5.

FIG. 6 is a cross-sectional view showing the drive IC chip 400 mounted on the pad portion 140 of the organic light-emitting display device according to the exemplary embodiment of the present invention. Referring to FIG. 6, an anisotropic conductive film 500 including the conductive balls 520 is formed on the pad portion 140, and the drive IC chip 400 is placed above the anisotropic conductive film 500. The bumps 430 of the drive IC chip 400 may, but not necessarily, correspond to protrusions and recesses of the conductive layer 104. When the bumps 430 of the drive IC chip 400 are compressed using, e.g., thermal compression, they are electrically connected to the conductive layer 104 as the conductive balls 520 are broken.

Figure 7:
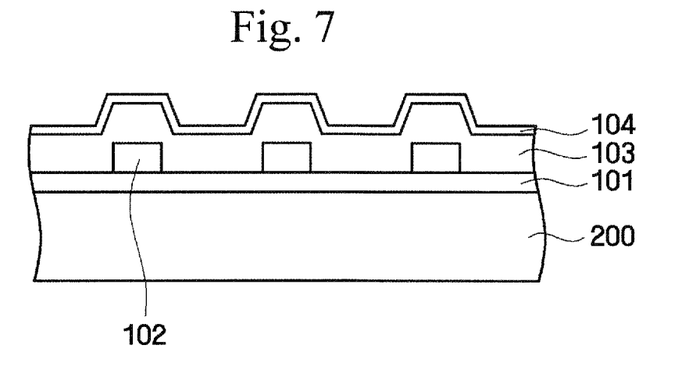
FIGS. 7 and 8 are cross-sectional views of an organic light-emitting display device according to another exemplary embodiment of the present invention.
Figure 8:
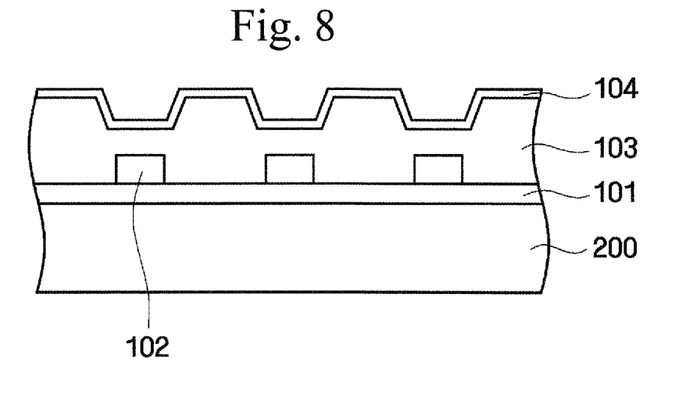

FIGS. 7 and 8 are cross-sectional views of an organic light-emitting display device according to another exemplary embodiment of the present invention.

The organic light-emitting display device according to the current exemplary embodiment includes a substrate 200, a buffer layer 101 formed on the substrate 200, a gate insulating layer 103 formed on the buffer layer 101, a conductive layer 104 formed to a uniform thickness on the gate insulating layer 103, a pixel defined layer exposing a portion of the conductive layer 104 to form a pad portion 140 connected to bumps of a drive IC chip, and a semiconductor layer 102 disposed under the pad portion 140 and formed between the gate insulating layer 103 and the buffer layer 101. First protruding and recessed patterns are formed on a portion of the semiconductor layer 102 which corresponds to the pad portion 104, and second protruding and recessed patterns formed on a portion of the gate insulating layer 103 which corresponds to the pad portion 140.

The organic light-emitting display device according to the current exemplary embodiment has the same configuration as the organic light-emitting display device according to the previous exemplary embodiment, except that the semiconductor layer 102 is formed between the gate insulating layer 103 and the buffer layer 101, that the first protruding and recessed patterns are formed on a portion of the semiconductor layer 102 which corresponds to the pad portion 140, that the second protruding and recessed patterns are formed on a portion of the gate insulating layer 103 which corresponds to the pad portion 140, and that the conductive layer 104 is formed to a uniform thickness.

The first protruding and recessed patterns of the semiconductor layer 102 may be formed in the same shape as the second protruding and recessed patterns of the gate insulating layer 103. Conversely, the first protruding and recessed patterns and the second protruding and recessed patterns may be formed alternately to protrude at different positions.

That is, as shown in FIG. 7, protruding regions of the semiconductor layer 102 may correspond to protruding regions of the gate insulating layer 103. Also, recessed regions of the semiconductor layer 102 may correspond to recessed regions of the gate insulating layer 103.

Conversely, as shown in FIG. 8, the protruding regions of the semiconductor layer 102 may correspond to the recessed regions of the gate insulating layer 103, and the recessed regions of the semiconductor layer 102 may correspond to the protruding regions of the gate insulating layer 103.

Figure 9:
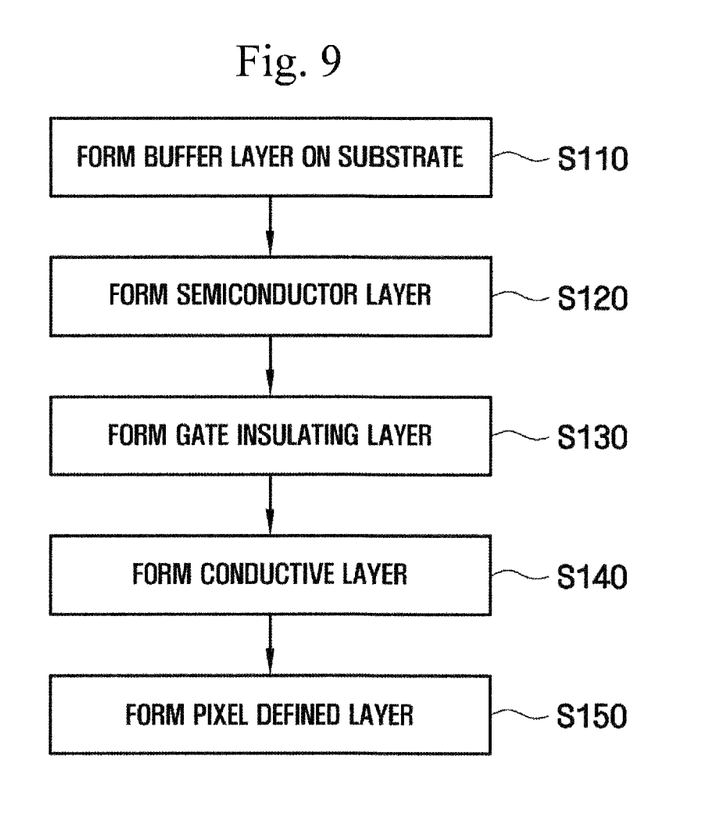
FIG. 9 is a flowchart illustrating a method of manufacturing an organic light-emitting display device according to an exemplary embodiment of the present invention.

Hereinafter, a method of manufacturing an organic light-emitting display device according to an exemplary embodiment of the present invention will be described with reference to FIGS. 9 through 14. FIG. 9 is a flowchart illustrating a method of manufacturing an organic light-emitting display device according to an exemplary embodiment of the present invention. FIGS. 10 through 14 are cross-sectional views sequentially illustrating the method of manufacturing an organic light-emitting display device according to the exemplary embodiment of the present invention.

The method of manufacturing an organic light-emitting display device according to the current exemplary embodiment includes forming a buffer layer on a substrate, forming a gate insulating layer on the buffer layer, forming a conductive layer on the gate insulating layer, and forming a pixel defined layer such that a portion of the conductive layer is exposed to form a pad portion connected to bumps of a drive IC chip. The forming of the conductive layer includes forming protrusions and recesses on a surface of a portion of the conductive layer which corresponds to the pad portion.

Figure 10:
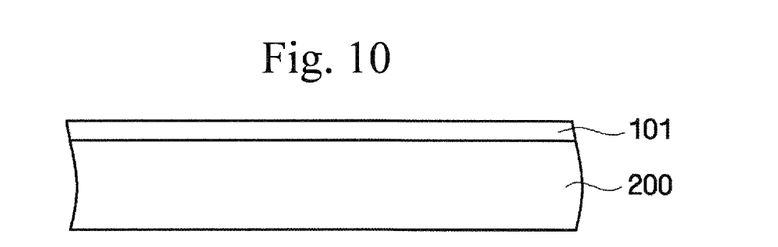
FIGS. 10 through 14 are cross-sectional views sequentially illustrating the method of manufacturing an organic light-emitting display device according to the exemplary embodiment of the present invention.

Referring to FIG. 10, a buffer layer 101 is formed on a substrate 200 (operation S110). As described above, the substrate 200 may be made, for example, of a transparent glass material containing $SiO_2$ as a main component, but is not limited thereto and thus may also be made of a transparent plastic material. The buffer layer 101 planarizes the substrate 200 and prevents penetration of impurities into the substrate 200. The buffer layer 101 may be made of silicon oxide or silicon nitride.

Figure 11:
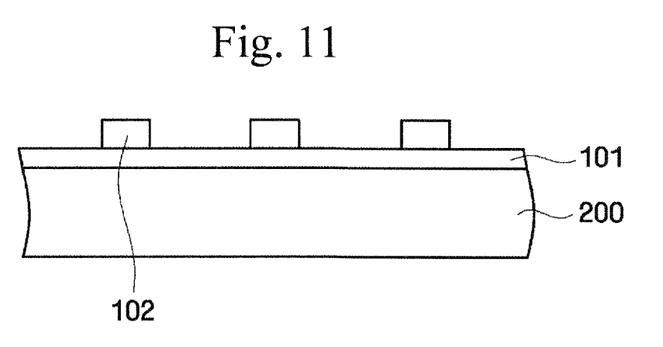

Referring to FIG. 11, a portion of a semiconductor layer 102 for forming a channel region in a transistor region is made to remain on the buffer layer 101 and patterned into protruding and recessed patterns (operation S120). As described above, the protruding and recessed patterns may also be formed directly on the buffer layer 101 and/or a gate insulating layer 103, instead of the semiconductor layer 102. In FIG. 11, the patterned portion of the semiconductor layer 102 exists on the buffer layer 101 in the form of protrusions spaced at regular intervals. However, the present invention is not limited thereto. For example, the semiconductor layer 102 may be formed on the entire surface of the buffer layer 101 and then patterned into protruding and recessed patterns.

Figure 12:
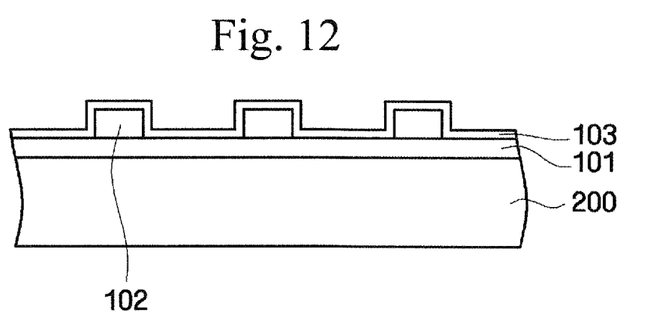
Figure 13:
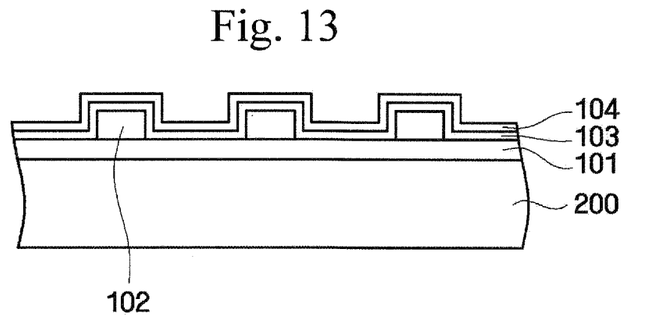

Referring to FIGS. 12 and 13, the gate insulating layer 103 and a conductive layer 104 are formed on the semiconductor layer 102 and/or the buffer layer 101 (operations S130 and 140). When the semiconductor layer 102 and/or the buffer layer 101 has protrusions and recesses, if the gate insulating layer 103 and the conductive layer 104 are formed on the semiconductor layer 102 and/or the buffer layer 101 having the protrusions and recesses, the gate insulating layer 103 and the conductive layer 104 may also have protruding and recessed patterns on surfaces thereof. As described above, protruding and recessed patterns may be formed directly on the gate insulating layer 103 disposed on the planar buffer layer 101 without the semiconductor layer 102 interposed therebetween. In this case, the conductive layer 104 formed on the gate insulating layer 103 may have protruding and recessed patterns identical to the protruding and recessed patterns of the gate insulating layer 103. Alternatively, the protruding and recessed patterns may be formed directly on the conductive layer 104.

The protruding and recessed patterns formed directly or indirectly on the conductive layer 104 increase the contact area between the conductive layer 104 and conductive balls 520, thereby reducing contact resistance. The reduced contact resistance can improve the reliability and performance of the organic light-emitting display device.

Figure 14:
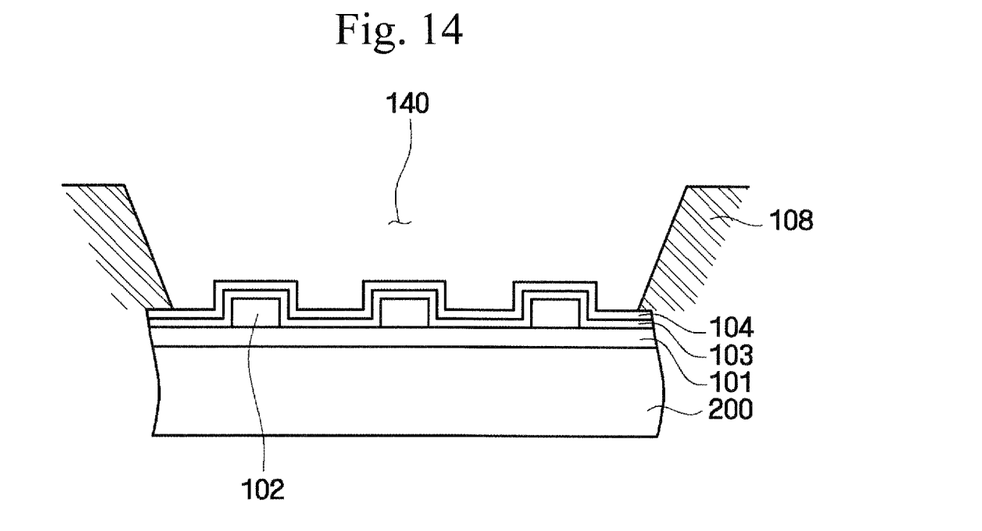

Referring to FIG. 14, a pixel defined layer 108 is formed to form a recessed pad portion 140 (operation S150).

Other elements of the current exemplary embodiment are identical to those of the previous exemplary embodiments, and thus any repetitive detailed description thereof is omitted.

Figure 15:
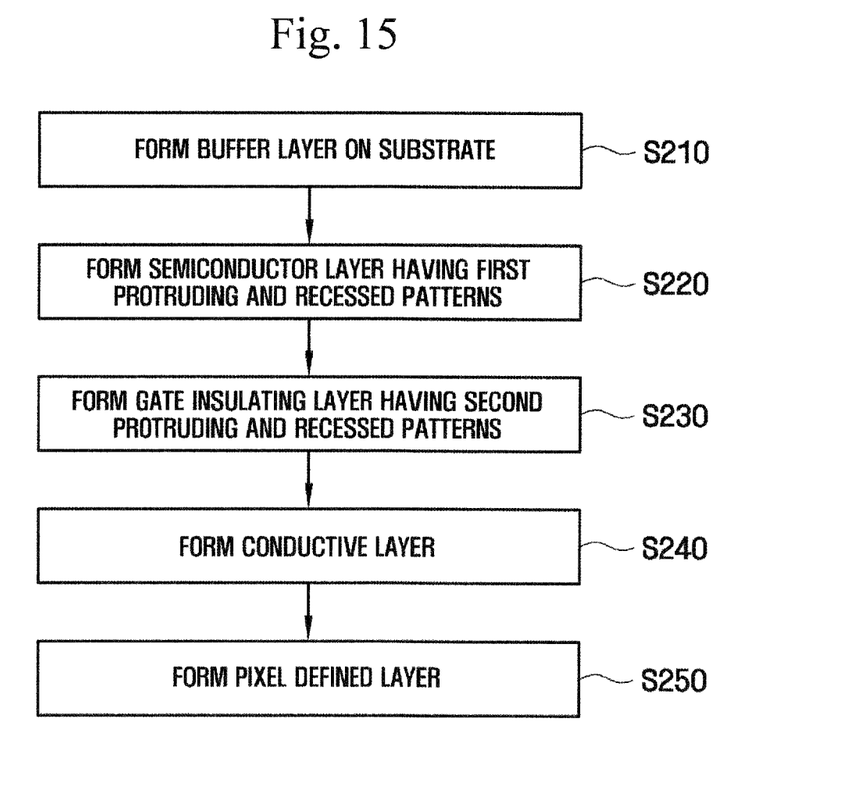
FIG. 15 is a flowchart illustrating a method of manufacturing an organic light-emitting display device according to another exemplary embodiment of the present invention.

Hereinafter, a method of manufacturing an organic light-emitting display device according to another exemplary embodiment of the present invention will be described with reference to FIG. 15. FIG. 15 is a flowchart illustrating a method of manufacturing an organic light-emitting display device according to another exemplary embodiment of the present invention.

The method of manufacturing an organic light-emitting display device according to the current exemplary embodiment includes forming a buffer layer on a substrate, forming a gate insulating layer on the buffer layer, forming a conductive layer to a uniform thickness on the gate insulating layer, forming a pixel defined layer such that a portion of the conductive layer is exposed to form a pad portion connected to bumps of a drive IC chip, and forming a semiconductor layer under the pad portion and between the gate insulating layer and the buffer layer. The forming of the semiconductor layer includes forming first protruding and recessed patterns on a portion of the semiconductor layer which corresponds to the pad portion by patterning the portion of the semiconductor layer. The forming of the gate insulating layer includes forming second protruding and recessed patterns on a portion of the gate insulating layer which corresponds to the pad portion.

The manufacturing method according to the current exemplary embodiment is the same as the manufacturing method according to the previous exemplary embodiment, except that the semiconductor layer is formed between the gate insulating layer and the buffer layer, that the first protruding and recessed patterns are formed on a portion of the semiconductor layer which corresponds to the pad portion, that the second protruding and recessed patterns are formed on a portion of the gate insulating layer which corresponds to the pad portion, and that the conductive layer is formed to a uniform thickness.

The first protruding and recessed patterns of the semiconductor layer may be formed in the same shape as the second protruding and recessed patterns of the gate insulating layer. Conversely, the first protruding and recessed patterns and the second protruding and recessed patterns may be formed alternately to protrude at different positions.

Other elements of the current exemplary embodiment are identical to those of the previous exemplary embodiment, and thus any repetitive detailed description thereof is omitted.

While the present invention has been particularly shown and described with reference to exemplary embodiments thereof, it will be understood by those of ordinary skill in the art that various changes in form and detail may be made therein without departing from the spirit and scope of the present invention as defined by the following claims. The exemplary embodiments should be considered in a descriptive sense only and not for purposes of limitation.

What is claimed is:

1. An organic light-emitting display device comprising:
   a substrate;
   a buffer layer formed on the substrate;
   a gate insulating layer formed on the buffer layer;
   a conductive layer formed on the gate insulating layer;
   a pixel defined layer exposing a portion of the conductive layer to form a pad portion connected to bumps of a drive integrated circuit (IC) chip, wherein protrusions and recesses are formed on a surface of the conductive layer; and
   a gate electrode formed on the conductive layer.

2. The display device of claim 1, wherein the conductive layer is made of a conductive metal material.

3. The display device of claim 1, wherein the conductive layer is made of one or more materials selected from the group consisting of indium tin oxide (ITO), indium zinc oxide (IZO), carbon nanotubes, nanowires, and a conductive polymer.

4. The display device of claim 1, wherein the conductive layer is electrically connected to the bumps by a plurality of conductive balls.

5. The display device of claim 4, wherein the conductive balls are smaller than the protrusions and recesses.

6. The display device of claim 1, further comprising an anisotropic conductive film disposed between the bumps and the conductive layer.

7. The display device of claim 1, further comprising a semiconductor layer formed in a region between the gate insulating layer and the buffer layer which corresponds to the pad portion.

8. The display device of claim 7, wherein the semiconductor layer is patterned into protrusions and recesses corresponding to the protrusions and recesses of the conductive layer.

9. The display device of claim 1, wherein a portion of the gate insulating layer, which corresponds to the pad portion, is patterned into protrusions and recesses.

10. The display device of claim 1, wherein a portion of the buffer layer, which corresponds to the pad portion, is patterned into protrusions and recesses.

11. An organic light-emitting display device comprising:
    a substrate;
    a buffer layer formed on the substrate;
    a gate insulating layer formed on the buffer layer;
    a conductive layer formed to a uniform thickness on the gate insulating layer;
    a pixel defined layer exposing a portion of the conductive layer to form a pad portion connected to bumps of a drive IC chip; and
    a semiconductor layer disposed under the pad portion and formed between the gate insulating layer and the buffer layer, wherein first protruding and recessed patterns are formed on a portion of the semiconductor layer which corresponds to the pad portion, and second protruding and recessed patterns are formed on a portion of the gate insulating layer which corresponds to the pad portion.

12. The display device of claim 11, wherein the first protruding and recessed patterns protrude at same positions as the second protruding and recessed patterns.

13. The display device of claim 11, wherein the first protruding and recessed patterns protrude at different positions from the second protruding and recessed patterns.

14. A method of manufacturing an organic light-emitting display device, the method comprising:
forming a buffer layer on a substrate;
forming a gate insulating layer on the buffer layer;
forming a conductive layer on the gate insulating layer;
forming a pixel defined layer such that a portion of the conductive layer is exposed to form a pad portion connected to bumps of a drive IC chip, wherein the forming of the conductive layer comprises forming protrusions and recesses on a surface of the exposed portion of the conductive layer which corresponds to the pad portion; and
forming a gate electrode on the conductive layer.

15. The method of claim 14, wherein the conductive layer is made of a conductive metal material.

16. The method of claim 14, wherein the conductive layer is made of one or more materials selected from the group consisting of ITO, IZO, carbon nanotubes, nanowires, and a conductive polymer.

17. The method of claim 14, wherein the conductive layer is electrically connected to the bumps by a plurality of conductive balls.

18. The method of claim 17, wherein the conductive balls are smaller than the protrusions and recesses.

19. The method of claim 14, further comprising forming an anisotropic conductive film between the bumps and the conductive layer.

20. The method of claim 14, further comprising forming a semiconductor layer in a region between the gate insulating layer and the buffer layer which corresponds to the pad portion.

21. The method of claim 20, wherein the semiconductor layer is patterned into protrusions and recesses corresponding to the protrusions and recesses of the conductive layer.

22. The method of claim 14, wherein a portion of the gate insulating layer, which corresponds to the pad portion, is patterned into protrusions and recesses.

23. The method of claim 14, wherein a portion of the buffer layer, which corresponds to the pad portion, is patterned into protrusions and recesses.

24. A method of manufacturing an organic light-emitting display device, the method comprising:
forming a buffer layer on a substrate;
forming a gate insulating layer on the buffer layer;
forming a conductive layer to a uniform thickness on the gate insulating layer;
forming a pixel defined layer such that a portion of the conductive layer is exposed to form a pad portion connected to bumps of a drive IC chip;
forming a semiconductor layer under the pad portion and between the gate insulating layer and the buffer layer, wherein the forming of the semiconductor layer comprises forming first protruding and recessed patterns on a portion of the semiconductor layer which corresponds to the pad portion by patterning the portion of the semiconductor layer, and the forming of the gate insulating layer comprises forming second protruding and recessed patterns on a portion of the gate insulating layer which corresponds to the pad portion.

25. The method of claim 24, wherein the first protruding and recessed patterns protrude at same positions as the second protruding and recessed patterns.

26. The method of claim 24, wherein the first protruding and recessed patterns protrude at different positions from the second protruding and recessed patterns.

* * * * *